Sept. 9, 1969 R. C. WEISCHEDEL 3,466,564

AMPLIFIER UNIT COMBINED WITH EXTERNALLY MOUNTED COMPONENTS FOR ESTABLISHING OPERATING CHARACTERISTICS THEREOF

Filed May 11, 1966

INVENTOR:
RICHARD C. WEISCHEDEL,
BY Norman C. Fulmer
HIS ATTORNEY.

United States Patent Office 3,466,564
Patented Sept. 9, 1969

3,466,564

AMPLIFIER UNIT COMBINED WITH EXTERNALLY MOUNTED COMPONENTS FOR ESTABLISHING OPERATING CHARACTERISTICS THEREOF

Richard C. Weischedel, Camillus, N.Y., assignor to General Electric Company, a corporation of New York
Filed May 11, 1966, Ser. No. 549,267
Int. Cl. H03f *3/18, 3/68*
U.S. Cl. 330—66 4 Claims

ABSTRACT OF THE DISCLOSURE

An amplifier arrangement is disclosed, in which a "universal" amplifier unit contains the basic circuitry of a multiple-stage amplifier. Certain components, however, such as coupling capacitors and feedback capacitors, which are to be different sizes or values for different models or applications of the amplifier, are not included in the amplifier unit but are provided in the external circuitry of the main equipment to which the amplifier unit is connected. The arrangement permits mass-production of a single-model amplifier unit which is of compact size and low cost.

This invention relates to electrical amplifier arrangements and particularly to multiple-stage amplifier arrangements wherein a variety of different desired amplifier characteristics are obtained by the choice of different values of amplifier components such as coupling capacitors and feedback capacitors.

Multiple-stage amplifiers are used in numerous applications, such as for audio amplification, and amplification of signals in a variety of scientific, test, and control equipment. Different amplifier characteristics are required for certain different uses. For example, different frequency response characteristics are likely to be required in a given application; an audio analysis device may require several amplifiers each having a different frequency band-pass characteristic.

It is, of course, more expensive to manufacture and stock numerous amplifier models having different frequency characteristics than it would be to mass-produce a single "universal" amplifier. A partial solution to this problem is to design the various amplifier models so that they are the same except for values of components which affect the frequency characteristics—for instance the values of the coupling networks (which can be single capacitors) affect the low-frequency response, and the values of the feedback networks (which can be single capacitors) affect the high-frequency response. Thus, a single "basic" multiple-stage amplifier can be manufactured and the various coupling and feedback capacitors can be plugged in or otherwise attached. However, the physical size of these capacitors varies considerably with the capacitance value—frequently a size ratio of more than two to one in physical size of capacitors required for the different desired frequency characteristics of an amplifier. Since adequate physical spaces must be provided in the amplifier to accommodate the largest sizes of capacitors to be used, there is, on the average, considerable wasted space in the amplifiers because, on the average, the capacitors employed will be smaller than the maximum size. This wasted space is costly, and also unduly enlarges the size of the equipment. The wasted space problem is all the more severe in multiple-stage transistorized amplifiers, in which the space consumed by the coupling and feedback capacitors usually is greater than that occupied by the transistors.

An object of the invention is to provide an improved multiple-stage amplifier arrangement.

Another object is to provide a universal multiple stage amplifier arrangement which can be mass produced at relatively low cost.

A further object is to provide a multiple-stage amplifier arrangement of compact size.

An additional object is to provide an improved multiple-stage amplifier arrangement in which the amplification characteristics can be changed.

Yet another object is to provide flexibility in achieving waveform shaping in a multi-stage amplifier.

Still other objects will be apparent from the following description and claims, and from the accompanying drawing.

The multiple-stage amplifier arrangement of the invention comprises, basically and in a preferred embodiment, a multiple-stage amplifier unit containing the circuitry of the various stages except for the components that are to be different for different models of the amplifier, and these components are located in the main equipment to which the amplifier unit is connected. In the preferred embodiment to be described, these components which are located in the main equipment are the interstage coupling capacitors and the feedback capacitors for the various stages. Thus, contrary to prior art arrangements, the amplifier unit of the present invention is a single-model, compact, universal amplifier unit which readily may be mass-produced.

In the drawing, FIGURE 1 is a prospective view showing a preferred embodiment of the amplifier unit and a portion of the equipment to which it is to be attached.

Figures 1, 2, 3:
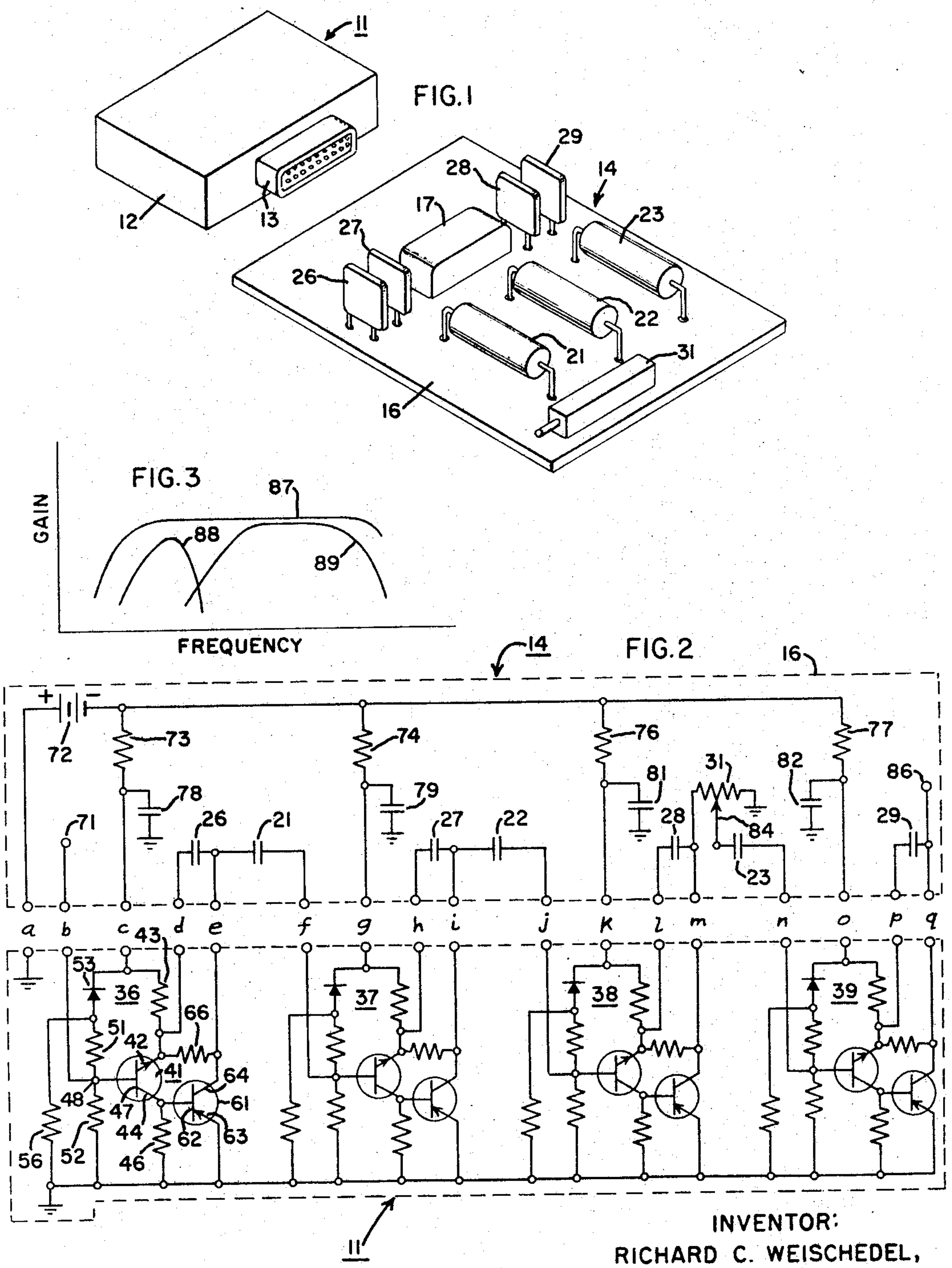
FIGURE 2 is an electrical schematic diagram of the arrangement of FIGURE 1.
FIGURE 3 is a plot of various frequency characteristics obtainable with the amplifier arrangement.

In FIGURE 1, the amplifier unit 11 comprises electrical circuitry contained in a suitable housing 12, and is provided with a multiple contact connector 13. The main equipment 14, to which the amplifier unit 11 is to be connected, is shown as comprising a circuit board 16 which carries a multiple contact connector 17 adapted to receive the connector 13.

A plurality of coupling capacitors 21, 22, and 23; a plurality of feedback capacitors 26, 27, 28 and 29; and a gain control potentiometer 31 are mounted on the circuit board 16 and interconnected by means of conductors (not shown) carried by the board, to provide a circuit as shown schematically in FIGURE 2.

Now referring to FIGURE 2, the amplifier unit 11 shown schematically within the dotted line, comprises a plurality of contacts indicated by the letters *a* through *q* which are contacts of the connector 13. The amplifier unit 11, as shown, contains 4 amplifier stages 36, 37, 38, and 39. The stages are substantially identical, and, with reference to the first stage 36, comprise a first amplifier transistor 41 having an emitter electrode 42 connected via a resistor 43 to a current supply terminal *c*. The emitter 42 also is connected to a feedback terminal *d*. A collector electrode 44 is connected to electrical ground via a load resistor 46, and a base electrode 47 is connected to the junction 48 of a pair of resistors 51 and 52 which are connected in series combination with a diode device 53, this series combination being connected between the terminal *c* and electrical ground. The resistor junction 48 is connected to a signal input terminal *b*. A resistor 56 is connected in parallel with the series resistors 51 and 52. A second amplifier transistor 61 has a base electrode 62 connected to the collector electrode 44 of transistor 41, an emitter electrode 63 connected to electrical ground, and a collector electrode 64 connected to a signal output terminal *e* and also connected via a resistor 66 to the emitter electrode 42 of the first transistor 41. The remaining amplifier stages 37, 38, and 39, being substantially identical to the first stage 36, will not be described in detail. The two transistors of each stage function to amplify the input signal, in well known manner, and the network comprising the diode device 53 and resistors 51, 52 and 56 functions as a temperature compensation arrangement.

The circuit board 16 of the main equipment 14 comprises circuitry shown schematically within the dotted line, which is shown to include a signal input terminal 71 connected to the contact *b*. A battery or other suitable current supply source 72 has a terminal connected to the contact *a* for connection to electrical ground in the amplifier unit 11, the other terminal of the current source 72 being connected, respectively, via filter resistors 73, 74, 76, and 77, to the terminals *c, g, k*, and *o*, filter capacitors 78, 79, 81, and 82 being respectively connected between these terminals and electrical ground.

The feedback capacitors 26, 27, 28, and 29 are respectively connected between terminals *d* and *e, h, i, l* and *m*, and *p* and *q*. The signal coupling capacitors 21, 22, and 23 are respectively connected between the terminals *e*, and *f, i*, and *j*, and *m* and *n*, the connection of capacitor 23 to terminal *m* being via the gain control potentiometer 31, this potentiometer being connected between terminal *m* and electrical ground and the capacitor 23 being connected to the adjustable tap 84 thereof. A signal output terminal 86 for the amplifier arrangement is connected to the terminal *q*.

As described above, the amplifier arrangement can be provided with different frequency characteristics by suitably choosing the values of the coupling capacitors 21, 22, 23, and the feedback capacitors 26, 27, 28, and 29. Larger values of the feedback capacitors reduced the high frequency amplification limit, and larger values of coupling capacitors extended the low frequency amplification limit. For example, in FIGURE 3 which shows total amplifier gain versus frequency, curve 87 is representative of a wide frequency range achieved by utilizing large values of coupling capacitors and relatively small values of feedback capacitors. Curve 88 is representative of a narrow band low frequency characteristic achieved by using relatively large values of coupling capacitors and relatively large values of feedback capacitors. Curve 89 is representative of a higher frequency band characteristic achieved by utilizing relatively low values of feedback capacitors and relatively low values of coupling capacitors.

As pointed out above, the physical size of the feedback and coupling capacitors, and especially of the coupling capacitors, varies considerably with their electrical values, so that if each of these capacitors were included in the amplifier unit 11 this unit would of necessity be considerably larger and would contain considerable wasted space on models utilizing smaller sizes of capacitors. By eliminating these variable-sized components from the amplifier unit 11, and including them in the main equipment 14, in accordance with the invention, the amplifier unit 11 is truly "universal," i.e., it is a one-model amplifier that can be readily mass-produced at reasonable cost, and also achieves the ultimate in compactness in the amplifier unit. In certain designs, the compact amplifier unit 11 is no larger than the space occupied by the coupling and feedback capacitors 21, 22, 23, and 26–29. Since the main equipment 14 is generally larger than the amplifier unit 11, it is not of particular consequence that the capacitors of various sizes are located therein. A further advantage of the invention is that the characteristics of the amplifier equipment can readily be changed by the user or main equipment manufacturer, by choice of the coupling and feedback components, which is generally easier and more economical than the prior art practice of changing these components when located in the amplifier unit 11.

While a preferred embodiment of the invention has been shown and described, various other embodiments and modifications thereof will be apparent to persons skilled in the art and will fall within the scope of invention as defined in the following claims.

What I claim is:

1. An amplifier arrangement comprising in combination:

(a) a multiple stage amplifier unit for connection to a main equipment unit, said amplifier unit containing a portion of the circuitry of a plurality of amplifier stages, including a first common power terminal, and each stage having a signal input terminal, a signal output terminal and second power terminal means; and (b) the main equipment unit being provided with a signal input terminal for connection to the signal input terminal of a first of said amplifier stages, a signal output terminal for connection to the signal output terminal of a last of said amplifier stages, means for supplying power to said amplifier unit including a first common power terminal and second power terminal means, a plurality of pairs of coupling terminals, each pair including a first terminal for connection to a signal output terminal of one stage of said amplifier unit and a second terminal for connection to the signal input terminal of another stage in said amplifier unit, and a plurality of coupling components for completing the circuitry of the amplifier stages and determining the frequency response of the amplifier arrangement, each coupling component being connected between one of the said pairs of coupling terminals, said amplifier unit connected to said main equipment so that said signal input terminal of said first amplifier stage is connected to said signal input terminal of said main equipment unit, said signal output terminal of said last amplifier stage is connected to said signal output terminal of said main equipment unit, said first common power terminal of said amplifier unit is connected to said first common power terminal of said main equipment unit the second power terminal means of each stage of said amplifier unit is connected to said second power terminal means of said main equipment unit, the signal output terminal of each of the stages other than the last in said amplifier unit are connected to a first terminal of one of said pairs of coupling terminals of said main equipment unit, and the signal input terminal of each of the stages other than the first in said amplifier unit are connected to the second terminal of one of the said pairs of coupling terminals so that the output terminal of each stage except said last stage is coupled to the input terminal of the next stage.

2. An amplifier arrangement according to claim 1 wherein said coupling components comprise capacitors.

3. An amplifier arrangement according to claim 1 wherein:

(a) each stage in said amplifier unit further includes a feedback terminal connected to apply feedback to each stage; and (b) said main equipment unit further includes a third terminal and a feedback coupling component associated with each pair of coupling terminals, said feedback coupling component being connected between the first terminal of said pair and said third terminal, each of said feedback terminals connected to one third terminal associated with each of said coupling terminal pairs so that feedback is coupled from the signal output terminal to the feedback terminal in a stage.

4. An amplifier arrangement according to claim 3 in which said feedback coupling components are capacitors.

References Cited

UNITED STATES PATENTS

| | | | |
|---|---|---|---|
| 2,894,077 | 7/1959 | McCoy | 330—66 |
| 3,134,049 | 5/1964 | Kilby | 330—66 X |

FOREIGN PATENTS

| | | |
|---|---|---|
| 823,292 | 11/1959 | Great Britain. |
| 1,084,333 | 6/1960 | Germany. |

NATHAN KAUFMAN, Primary Examiner

U.S. Cl. X.R.

330—17